(12) United States Patent
Jin et al.

(10) Patent No.: US 8,072,719 B2
(45) Date of Patent: Dec. 6, 2011

(54) SYSTEMS, CIRCUITS, CHIPS AND METHODS WITH PROTECTION AT POWER ISLAND BOUNDARIES

(75) Inventors: Darmin Jin, Fremont, CA (US); Brian Cheung, San Bruno, CA (US); Steve Skala, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 741 days.

(21) Appl. No.: 11/967,382

(22) Filed: Dec. 31, 2007

(65) Prior Publication Data

US 2008/0297961 A1  Dec. 4, 2008

Related U.S. Application Data

(60) Provisional application No. 60/934,923, filed on Dec. 31, 2006, provisional application No. 60/999,760, filed on Dec. 31, 2006.

(51) Int. Cl.
*H02H 9/00* (2006.01)
*H01C 7/12* (2006.01)
*H02H 1/00* (2006.01)
*H02H 1/04* (2006.01)
*H02H 3/22* (2006.01)
*H02H 9/06* (2006.01)

(52) U.S. Cl. ......................................... 361/56; 361/118
(58) Field of Classification Search ........................ None
See application file for complete search history.

(56) References Cited

U.S. PATENT DOCUMENTS

| | | | |
|---|---|---|---|
| 5,528,190 A | 6/1996 | Honnigford | |
| 5,654,862 A | 8/1997 | Worley et al. | |
| 5,917,220 A | 6/1999 | Waggoner | |
| 6,414,533 B1 | 7/2002 | Graves | |
| 6,631,502 B2 | 10/2003 | Buffet et al. | |
| 7,000,214 B2 | 2/2006 | Iadanza et al. | |
| 7,051,306 B2 | 5/2006 | Hoberman et al. | |
| 7,348,804 B2 | 3/2008 | Hoberman et al. | |
| 7,415,680 B2 | 8/2008 | Hoberman et al. | |
| 2004/0268278 A1 | 12/2004 | Hoberman et al. | |
| 2005/0091629 A1 | 4/2005 | Eisenstadt et al. | |
| 2005/0114814 A1 | 5/2005 | Correale, Jr. et al. | |
| 2006/0107077 A1 | 5/2006 | Roth et al. | |
| 2006/0158222 A1 | 7/2006 | Gattiker et al. | |
| 2008/0030223 A1 | 2/2008 | Arsovski et al. | |
| 2008/0074171 A1* | 3/2008 | Bhattacharya et al. | 327/538 |
| 2008/0077818 A1 | 3/2008 | Rauschmayer et al. | |
| 2008/0080107 A1* | 4/2008 | Chow et al. | 361/56 |
| 2008/0229121 A1 | 9/2008 | Lassa et al. | |

(Continued)

FOREIGN PATENT DOCUMENTS

EP  1 473 685 A2  11/2004

OTHER PUBLICATIONS

International Search Report mailed May 21, 2008, for International Application No. PCT/US2007/089190.

(Continued)

*Primary Examiner* — Dharti Patel

(74) *Attorney, Agent, or Firm* — Brinks Hofer Gilson & Lione

(57) ABSTRACT

Integrated circuits where the standard isolation cell, at power island boundaries, also includes a protection device, which clamps transient voltages.

50 Claims, 6 Drawing Sheets

U.S. PATENT DOCUMENTS

2009/0049321 A1* 2/2009 Balatsos et al. .............. 713/324
2009/0167093 A1 7/2009 Nguyen et al.
2009/0204835 A1 8/2009 Smith et al.
2009/0204837 A1 8/2009 Raval et al.

OTHER PUBLICATIONS

Written Opinion of the International Searching Authority mailed on May 21, 2008, for International Application No. PCT/US2007/089190.

International Search Report mailed Aug. 14, 2008, for International Application No. PCT/US2007/089205 (4 pages).

Written Opinion of the International Searching Authority mailed on Aug. 14, 2008, for International Application No. PCT/US2007/089205 (6 pages).

U.S. Office Action dated Sep. 22, 2009, directed against U.S. Appl. No. 11/967,580 (15 pages).

U.S. Office Action dated Apr. 7, 2010, directed against U.S. Appl. No. 11/967,580 (13 pages).

First Office Action of China State Intellectual Property Office directed against Chinese Application No. 200780048906.9, dated Nov. 30, 2010 (3 pgs.).

Office Action of the IPO directed against ROC (Taiwan) Application No. 096151676, dated Apr. 14, 2011 (4 pgs.).

* cited by examiner

*Island Shut Down*

*Resume Sequence:*

SYSTEMS, CIRCUITS, CHIPS AND METHODS WITH PROTECTION AT POWER ISLAND BOUNDARIES

CROSS-REFERENCE TO RELATED APPLICATIONS

Priority is claimed from U.S. applications 60/934,923 (formerly numbered as Ser. No. 11/618,874) and 60/999,760 (formerly numbered as Ser. No. 11/618,875), both filed Dec. 31, 2006, and each hereby incorporated by reference in its entirety.

BACKGROUND

The present application relates to systems and integrated circuits which include multiple independently powered-up "power islands" inside a single integrated circuit.

Many portable electronic systems are critically limited by battery life. For example, users do not like heavy cell phones, but users also do not like their cell phones to run out of power and shut down. One way to improve battery life is to increase the energy efficiency of the electronics components in the portable system.

As the constraints of low-power integrated circuits have steadily become tighter, the technique of power islands has become more important. In this technology some portions of an integrated circuit are powered up only on an "as-needed" basis.

It should be noted that power islands technology is very different from smart power technology. See e.g. Smart Power ICs (2.ed. Murari et al. 1995). In smart power technology logic or mixed-signal stages, operating at normal supply voltages, are combined in the same chip with higher-voltage driver circuits. Special device structures, which would not be used in a pure logic or mixed-signal chip, are commonly used to permit use of both high-voltage and low-voltage areas.

The use of on-chip power islands has many advantages for reducing power consumption, but the inventors have realized that there are also some surprising difficulties, which are addressed by the various inventions described in the present application.

Some of the points of invention will now be described, followed by additional explanation of the benefits of those points.

SUMMARY

The present application discloses new approaches to power island architecture: overvoltage and/or undervoltage protection is added to the isolation circuitry. Preferably the isolation circuitry, including the protection circuitry, is used on every line which crosses a power island boundary. Some possible exceptions to this are detailed below, along with many other implementation details, modifications, and variations.

Following is some further background, and explanation of advantages, which does not necessarily limit any of the claimed inventions.

Isolation is commonly used at the boundaries of power islands (and elsewhere), to suppress propagation of unknown states or transients. The isolation cells may force a line low, or force it high, or (less commonly) preserve the last valid state of the line.

Overvoltage and overcurrent protection has long been used at the external connections of integrated circuits. However, the present inventors have realized that, with scaling, some of these issues must now be addressed again, at the internal nodes of an integrated circuit.

Several factors have contributed to this. One is the extremely low operating voltages which are now commonly required for operation in battery-powered applications. A related one is that device scaling has produced increasingly fragile device structures. A further factor is that power switching to the power islands themselves can introduce transients in local lines. A further factor is that, for robust design practices, it is useful for the chip designers not to have to study the detailed specifications for transient voltage generation and vulnerability for each block of circuitry which is used. A further factor is that standard isolation cell blocks are used routinely anyway, in designs which include power islands, so adding overvoltage protection into the isolation cell gives more robustness to designs, with very little burden on engineering manpower or turnaround time.

The disclosed innovations replace standard isolation cells, in designs having power islands, with protected-isolation cells. In one class of embodiments, the protected-isolation cells are used for every digital line which crosses a power island boundary. In another class of embodiments, protected-isolation cells are used for every digital line which crosses a power island boundary, except for clock lines where skew or phase shift are particularly undesirable.

The disclosed innovations, in various embodiments, provide one or more of at least the following advantages:

Improved reliability.
Less vulnerability to transients caused by on-chip switching.
Less need to soften on-chip switching transitions.
Greater immunity to induced transients (where on-chip conductors act as parasitic antennas, and are driven by external electromagnetic fields).
No additional engineering burden.
Greater ease of using existing or external design blocks within a chip design.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION

The numerous innovative teachings of the present application will be described with particular reference to presently preferred embodiments (by way of example, and not of limitation).

Logic Isolation Control (ON-Island Isolation from OFF-Island(s) Effects)

In a preferred embodiment, Island power down of logic modules and RAM blocks can be physically accomplished with Analog power gating/switching cells. However, careful consideration is required to ensure that Logical state of the rest of the controller is maintained during island power removal, un-powered logic standby, and re-application of power to one or more islands.

Figure 1:
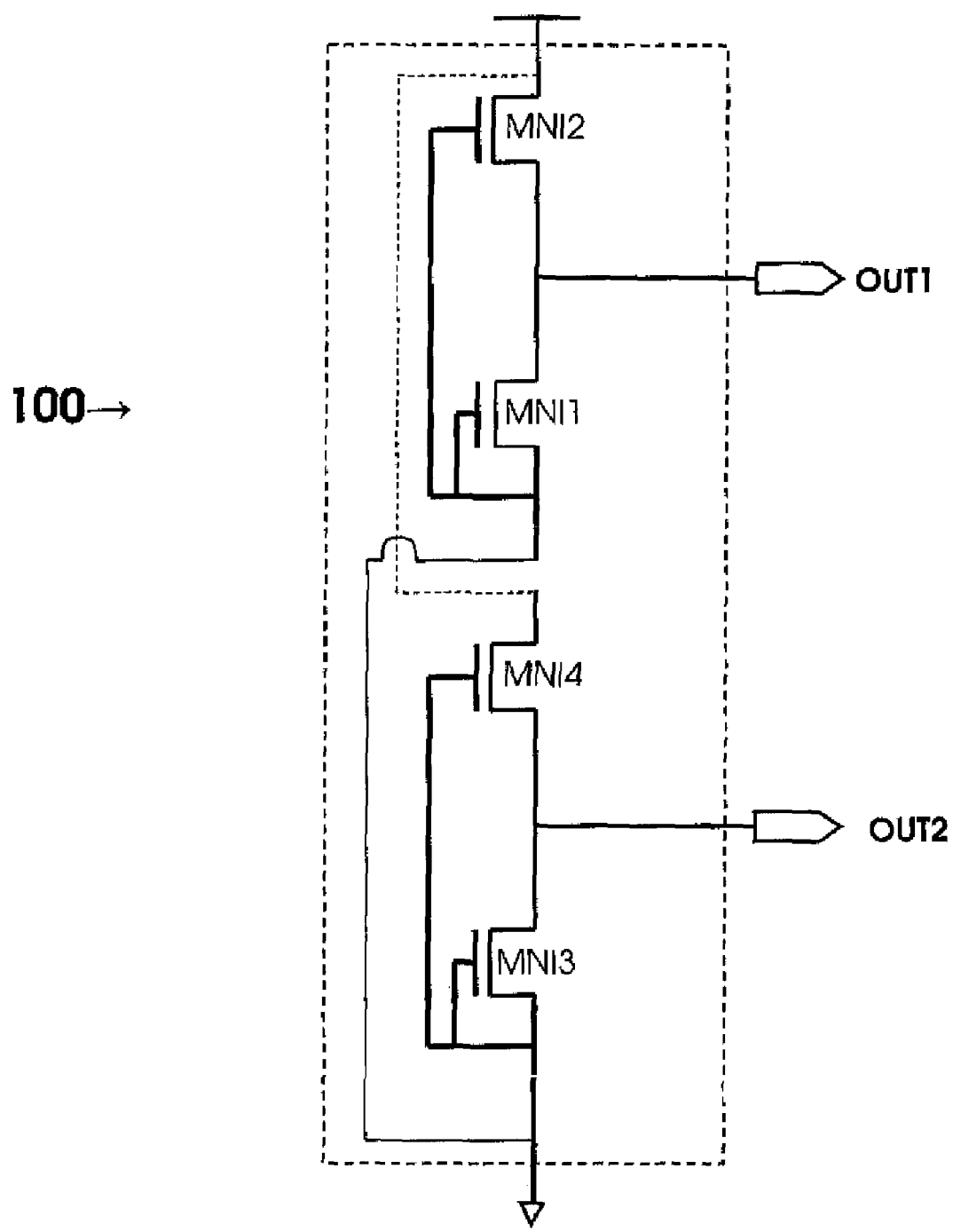
FIG. 1 shows an example of the protection circuit which is added to the appropriate isolation cell, in the presently preferred embodiment.

FIG. 1 shows an example of the protection circuit which is added to the appropriate isolation cell, in the presently preferred embodiment. The illustrated structure shows overvoltage/undervoltage clamping for two lines, OUT1 and OUT2. (The other connections of OUT1 and OUT2 are not affected by this block.) The isolation component is provided by a capacitor from OUT1 to ground, and another from OUT2 to ground. This provides the complete protected isolation cell 100. In this configuration, if OUT1 exceeds the positive supply voltage VDD by more than a diode drop, MNI2 will turn on to pull OUT1 down to VDD+VTN. Similarly, if OUT1 goes below ground by more than a diode drop, MNI1 will turn on to pull OUT1 up to −VTN. In the presently preferred embodiment MN1 and MN2 have a W/L ratio of 6:1, but this ratio can be as large as layout permits. Preferably this ratio is at least 3:1, to provide adequately low clamping impedance.

Figure 2:
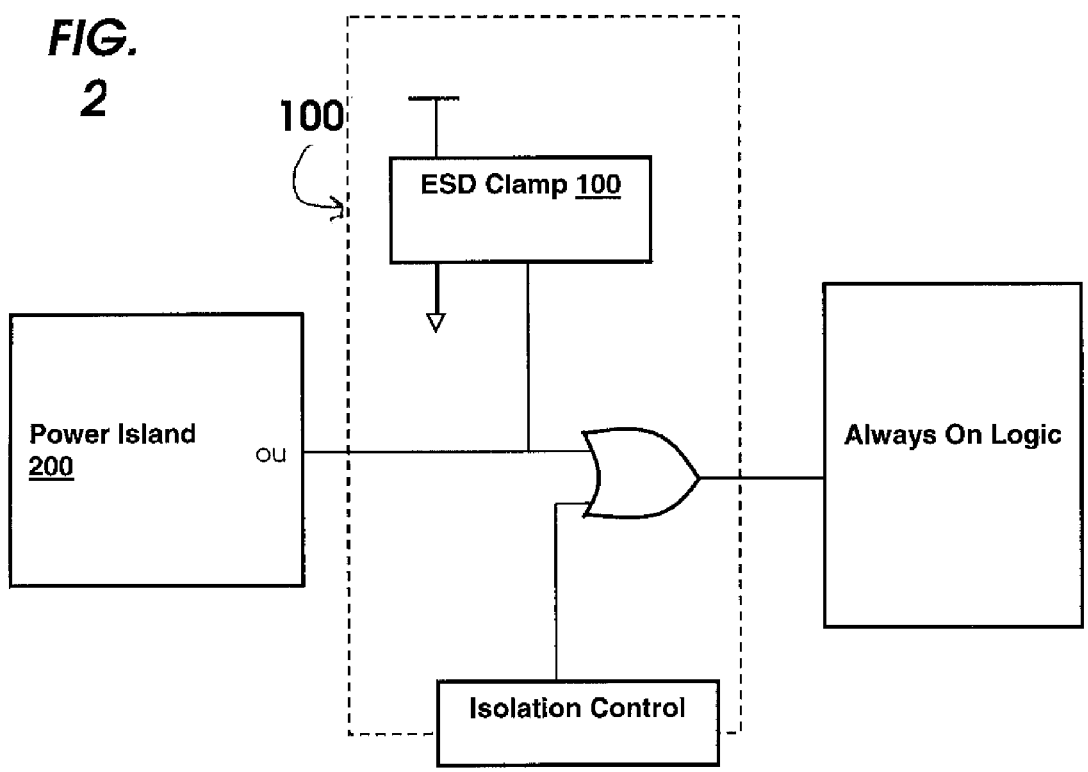
FIG. 2 shows how the protection stage of FIG. 1 is preferably combined with signal isolation at power island boundaries.

FIG. 2 shows how the protection stage of FIG. 1 is preferably combined with signal isolation at power island boundaries. In this example the isolation logic is simply shown as an OR, but of course many other logic relations can be used if desired. In this example a logic output from power island 200 is not only gated by the isolation gate, but also clamped by a clamp circuit 100. In this example a single line running from a power island to always-on logic is shown, but the illustrated implementation is also applicable to isolation between independent power islands. Thus FIG. 2 shows an example of the protected-isolation block 100'.

Figure 3:
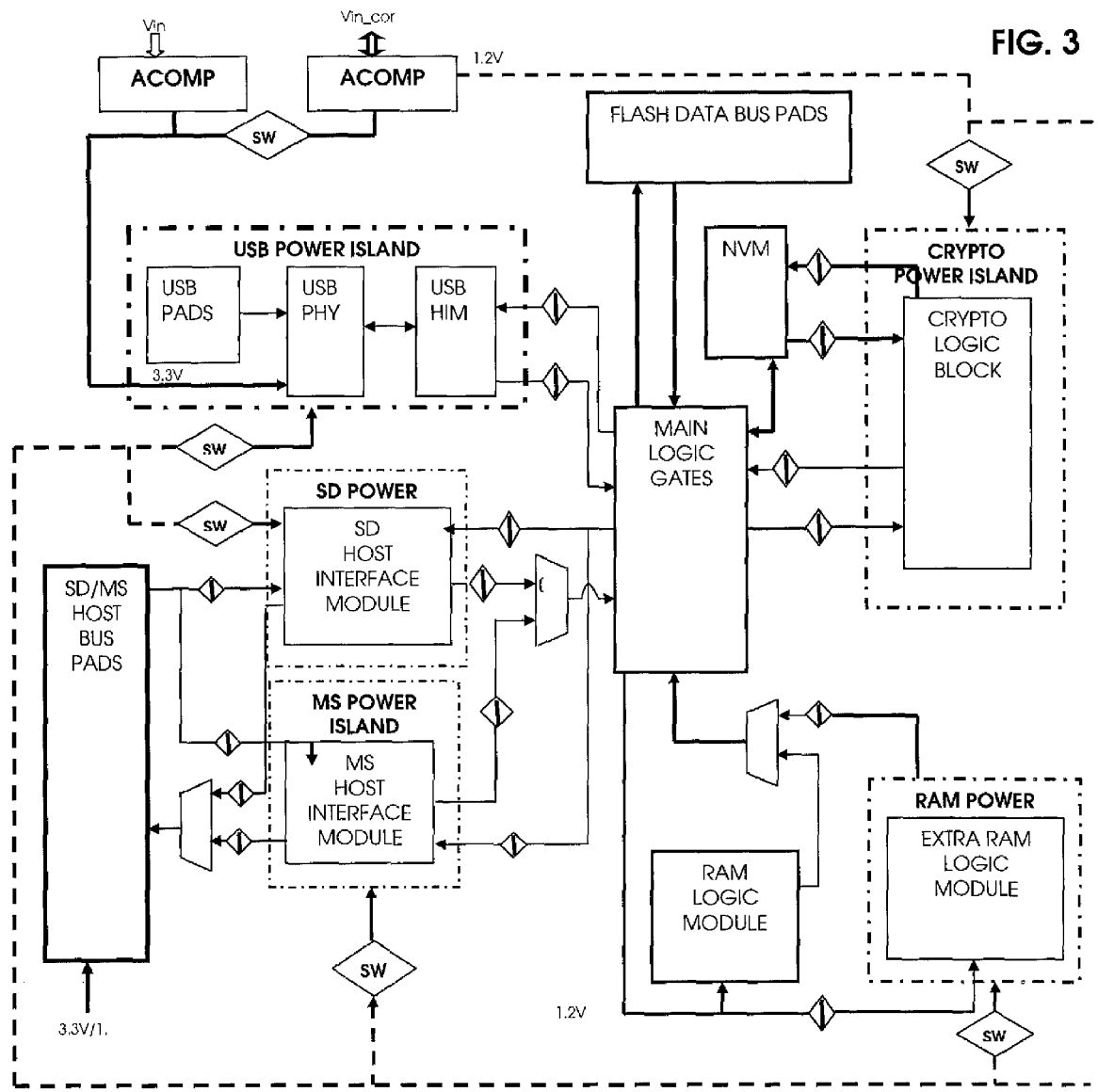
FIG. 3 shows an example of a chip in which the cells of FIG. 1 have been used advantageously.

FIG. 3 shows an example of a chip in which the cells of FIG. 1 have been used advantageously. Note, for example, the diamond-shaped blocks between NVM and Crypto blocks; these are discussed in more detail below. This particular design includes a number of dynamically-switched power islands, but the detailed operation of these power islands is not essential to understand the operation of the disclosed protected-isolation blocks 100'.

Figure 4:
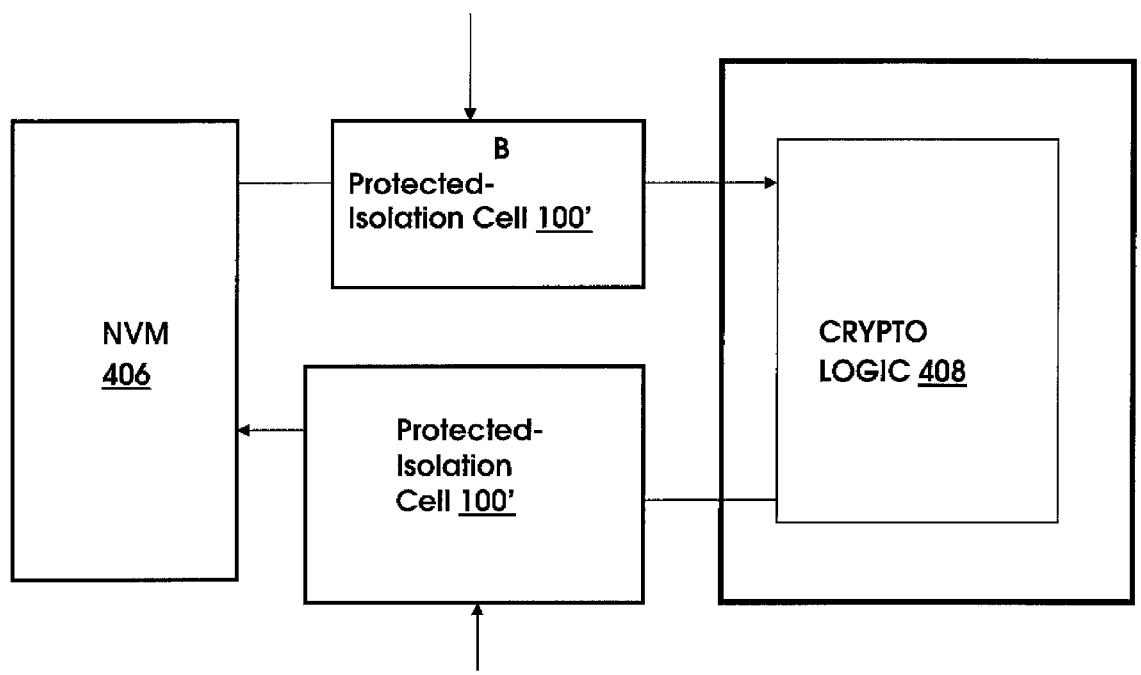
FIG. 4 is a detail view of a particular example, within the chip of FIG. 3, where isolation as in FIG. 2 is advantageously used.

FIG. 4 is a detail view of a particular example, within the chip of FIG. 3, where isolation as in FIG. 2 is advantageously used. This example shows a detail of the interface between the nonvolatile memory 406 ("NVM") and the crypto logic 408 of FIG. 3. Note that, as also shown in FIG. 3, the crypto logic 408 is inside a dynamic power island.

Power islands that can be turned on and off during operation require special clock and reset sequencing, along with logic isolation and isolation removal, to avoid glitches or indeterminate state. Brief descriptions of the required sequences are provided here.

Figure 5A:
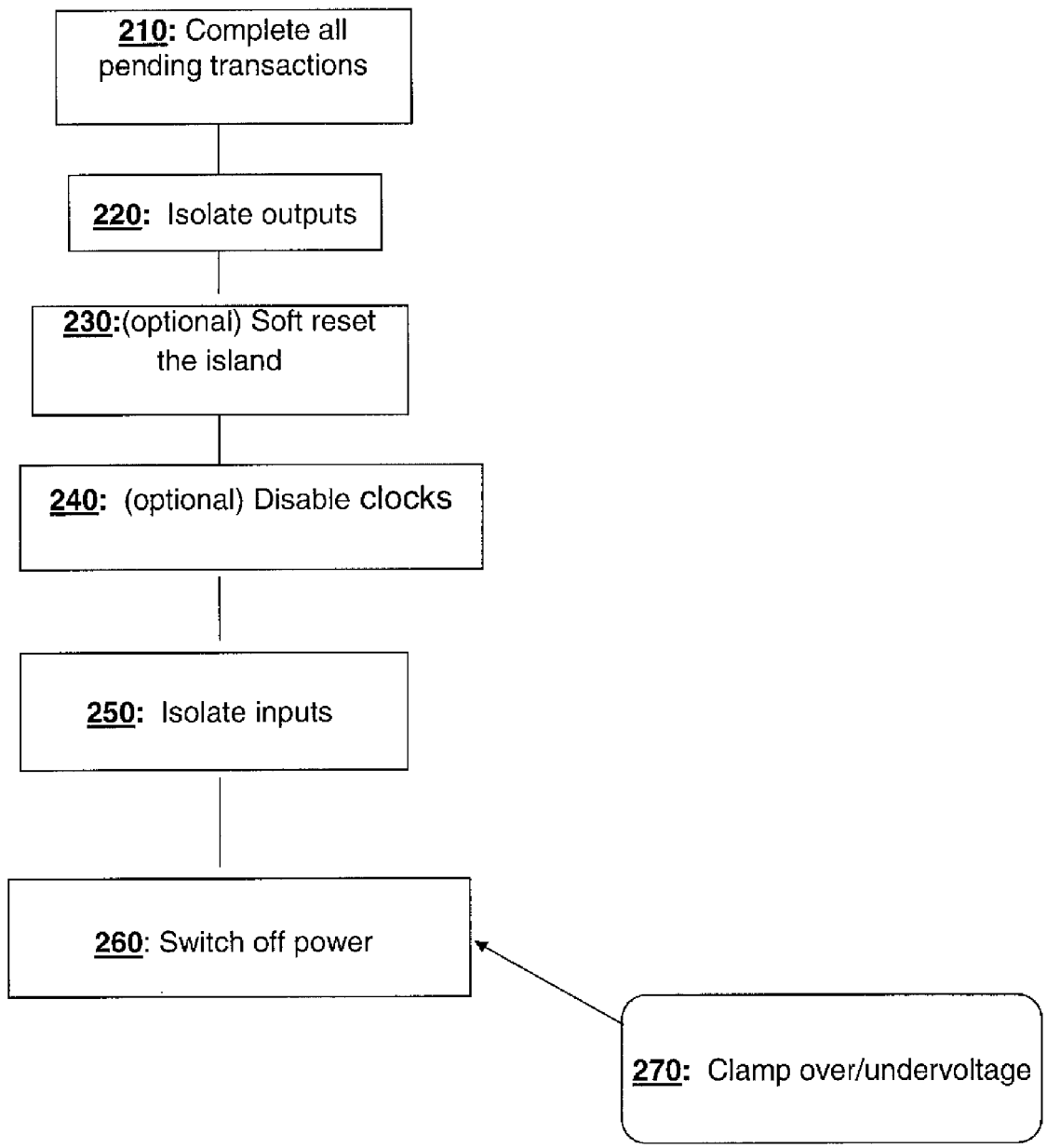
FIG. 5A is a flowchart of the general sequence of shutting down a power island.

As shown in FIG. 5A, the general sequence of shutting down a power island, in this example, is:
(Step 210) Make sure that all pending transactions to/from power island to be shut down are completed and the interface to the island is idle
(Step 220) Isolate output signals from the power island that will be shut down.
(optional Step 230) Soft reset the power island that is to be shut down (and hold in reset).
(optional Step 240) Disable clocks to the power island that will be shut down.
(Step 250) Isolate input signals from power island that will be shut down.
(Step 260) Switch off power delivery to island.

All of these steps, and especially step 260, are accompanied by the important simultaneous action 270 of clamping overvoltages or undervoltages, using, for example, a stage like the stage 100 shown in FIG. 1.

Figure 5B:
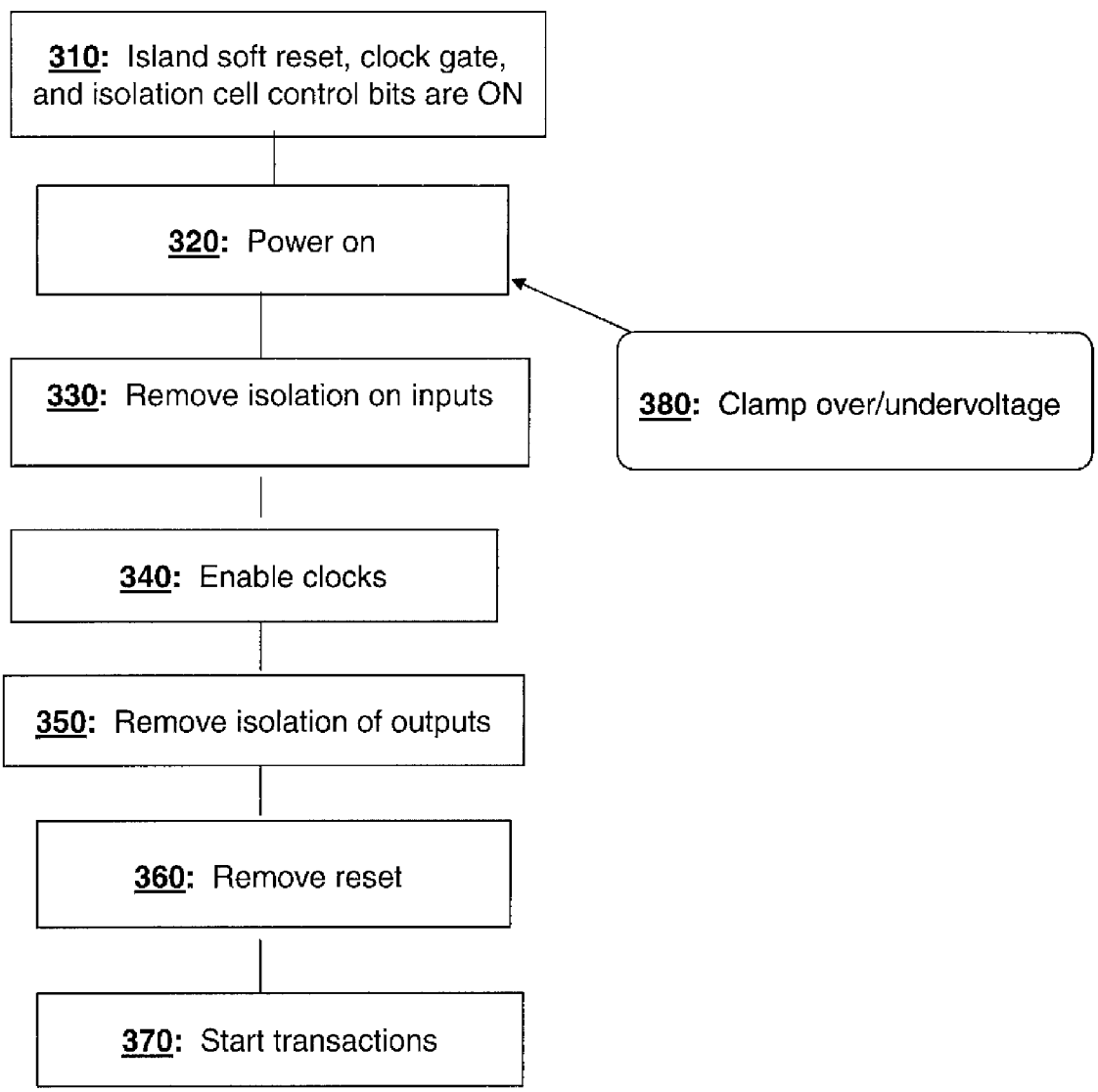
FIG. 5B is a flowchart of the general sequence of restoring power.

As shown in FIG. 5B, the general resume sequence will be to:
(Step 310) Check that the island soft reset, clock gate, and isolation cell control bits are ON and the interface to island is still in idle state
(Step 320) Switch on power delivery to the island. (From step A, reset is still driven to island, clocks are blocked and island outputs are still isolated)
(Step 330) Remove isolation of input signals from power island.
(Step 340) Enable clocks to island (while island is still held in reset)
(Step 350) Remove isolation of output signals from power island (while island is still held in reset)
(Step 360) Remove reset to power island
(Step 370) Start transactions using the island All of these steps, and especially step 320, are accompanied by the important simultaneous action 380 of clamping overvoltages or undervoltages, using, for example, a stage like the stage 100 shown in FIG. 1.

In a sample embodiment, four additional Island control registers (Output Isolation Cell control, Input Isolation Cell control, Soft Reset control, and Clock Gating control) provide bit-per-island control of the Island Power ON and OFF sequences. A fifth register (Power Island Switch OK) provides bit-per-island status of the power island Analog switches. Firmware has full control of the sequencing procedure, so timing can be optimized for product reliability and performance.

Following is additional detail regarding the sample implementation context of FIG. 3. However, it must be understood that this is simply one example of a design with dynamic power islands, and the claimed inventions are applicable to any other design which includes power islands.

Tripoli Power Islands

In the example of FIG. 3, there are preferably five power islands, as listed in the following table. Power islands refer to sections of the chip that can be powered on/off independently from other areas of the chip to minimize total power budget during non-operation, standby or test modes. The rest of the chip will always be powered on. This always-on section of the chip should include the following items (BE, most RAM, PWR_CONTROL, ACOMP/ASECURE blocks, 10 pad ring and miscellaneous glue logic).

TABLE 1

Power Islands Description Table

| Island | Description |
|---|---|
| SD HIM | (normally static Voltage Island) Secure Digital Contains all the front end logic for this host interface module |
| MS HIM | (normally static Voltage Island) Memory Stick Contains all the front end logic for this host interface module |
| USB HIM | (normally static Voltage island) Both 3.3 V and 1.2 V sections exist but do not power down independently from each other). Universal Serial Bus - contains all the front end logic for this host interface module + the USB PHY |

TABLE 1-continued

Power Islands Description Table

| Island | Description |
|---|---|
| CRYP | (normally dynamic Voltage island non-NVM CryptoFlash block)<br>Note: the NVM part of this logic, should be placed in always on island and isolated from rest of crypto logic. |
| RAM2 | (normally dynamic Voltage Island - 128K ORAM) |

Island Control Mechanisms

Once the logic and RAM have been logically partitioned into discrete islands, several mechanisms must be added to control the islands and enable standby power savings under the necessary product configurations and conditions:

System Core power gating and control (Host supply regulation and Analog power isolation switches)

Product package detection (SD/MMC, USB, or MS product configuration)

Static Island configuration (enable one HIM, disable other two)

Dynamic Island control and status (CRYPTO, ORAM power-up, power-down sequence timing)

Logic Gate Isolation Control (ON-Island isolation from OFF-island(s) effects)

System Core Power Gating and Control (Analog Switches)

In this sample embodiment, Tripoli handles three major Power functions:

Regulation of host-supplied power from either a (3.3V or 1.8V) SD/MMC or MS host, or a (5V) USB host.

Switching the supply lines to the required power islands based upon the static (product configuration) and dynamic island control (for standby suspend and resume) of the Crypto and ORAM power islands.

Island Supply switching control and status—Analog power switching must minimize impact on system Core power.

Power Island/Isolation Cell/Reset/Clock Gating Control

All registers mentioned in this preferred embodiment are hardware reset only by power on reset (POR_N). In addition to being accessible via the system clock domain the registers will also be accessible in the jtag domain for test mode access. The backend Peripheral Access Mode (BE PAM) logic takes care of synchronization between the domains. The system clock must be running for firmware to have access to these registers. For JTAG access to those registers in order to sequence the power islands for test mode functions, both jtag clock and system clock must be running.

According to various (but not necessarily all) embodiments, there is provided: A method for operating an integrated circuit which contains multiple power islands, comprising the actions of: a) clamping the voltage of at least some digital signals at power island boundaries; and b) isolating at least some digital signals at said power island boundaries; wherein said actions (a) and (b) are jointly performed, for a respective line at a respective boundary, by a respective protected-isolation cell.

According to various (but not necessarily all) embodiments, there is provided: A method for operating an integrated circuit which contains multiple power islands, comprising the actions of: a) clamping at least some digital signals at power island boundaries, to thereby suppress both overvoltages and undervoltages; and b) isolating at least some digital signals at said power island boundaries; wherein said actions (a) and (b) are jointly performed, for a respective line at a respective boundary, by a respective protected-isolation cell.

According to various (but not necessarily all) embodiments, there is provided: A method for operating an integrated circuit which contains multiple power islands, comprising the actions of: a) clamping substantially all digital signals which cross any power island's boundary, to thereby suppress overvoltages and undervoltages; and b) isolating substantially all non-clock digital signals at said power island boundaries, to thereby suppress propagation of signals across a powered-down island's boundary; wherein said actions a and b are jointly performed, for a respective line at a respective boundary, by a respective protected-isolation cell.

According to various (but not necessarily all) embodiments, there is provided: An integrated circuit comprising: at least one power island; and protected—isolation cells, where digital signals connect to said power island, which both clamp voltage excursions of the signals when the island is ON, and isolate the island when it is OFF.

According to various (but not necessarily all) embodiments, there is provided: An integrated circuit comprising: multiple power islands; and protected—isolation cells, at substantially all locations where non-clock digital signals connect to one of said power islands, which both clamp voltage excursions of the signals when the island is powered on, and isolate the island when it is powered off.

According to various (but not necessarily all) embodiments, there is provided: An integrated circuit comprising: at least one power island, containing electrical circuits which are not always powered up; and a plurality of protected-isolation cells, electrically interposed between said circuits and digital signal lines; wherein ones of said protected-isolation cells also contain voltage clamps; wherein, when said island is powered up, said protected-isolation cells connect digital signals between said circuits and said digital signal lines, while limiting voltage excursions on said lines; and wherein, when said island is not powered up, said protected-isolation cells prevent propagation of signals from said circuits onto said digital signal lines.

According to various (but not necessarily all) embodiments, there is provided: A circuit comprising: a power island; circuit elements within said power island, which are operatively connected to receive and send signals on a plurality of input/output lines; and a protection and isolation circuit, located on a respective one of said input/output lines, which both disconnects said respective line when said power island is powered down separately, and clamps voltage excursions on said respective line.

According to various (but not necessarily all) embodiments, there is provided: Integrated circuits where the standard isolation cell, at power island boundaries, also includes a protection device, which clamps transient voltages.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

The overvoltage clamp circuit illustrated in the sample embodiment is merely an example, and many others can be substituted.

Note also that the preferred embodiment clamps undervoltages as well as overvoltages. This is preferable, but it is contemplated that alternative embodiments can use a clamp structure which only clamps overvoltages.

It is preferable, but not strictly necessary, that the clamp circuits used should be compatible with core logic design rules, and should not require use of deep diffusions or other process steps which are not normally used within core logic.

Note that the presently preferred embodiment uses manual placement of the protected isolation blocks by the designer. However, depending on the design software environment, it is also contemplated that insertion of protected-isolation blocks can be automated in the future.

Reference is also made to the following commonly owned and copending U.S. Patent Applications, each and every one of which is hereby incorporated by reference in its entirety: 60/934,936 filed Dec. 31, 2006; 60/921,507 filed Dec. 31, 2006; 60/934,918 filed Dec. 31, 2006; 60/934,917 filed Dec. 31, 2006; 60/999,760 filed Dec. 31, 2006; 60/934,923 filed Dec. 31, 2006; 60/934,937 filed Jan. 1, 2007; 60/921,508 filed Jan. 1, 2007; Ser. No. 11/618,849 filed Dec. 31, 2006; Ser. No. 11/618,852 filed Dec. 31, 2006; Ser. No. 11/618,865 filed Dec. 31, 2006; Ser. No. 11/618,867 filed Dec. 31, 2006; Ser. No. 11/649,325 filed Dec. 31, 2006; Ser. No. 11/649,326 filed Dec. 31, 2006; Ser. No. 11/965,943 filed Dec. 28, 2007; Ser. No. 11/966,012 filed Dec. 28, 2007; and Ser. No. 11/966,147 filed Dec. 28, 2007. None of these applications are necessarily related to the present application, but many of these these help to show features which were designed into the same system as the ideas described above, and/or which combine synergistically with those ideas. Some ones of these copending applications may have overlapping inventorship with the present application, and hence be eligible for a domestic priority claim under U.S. law, but priority is not necessarily claimed nor disclaimed at this time.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A method for operating an integrated circuit which contains multiple power islands, comprising the actions of:
    a) clamping the voltage of at least some digital signals at power island boundaries; and
    b) isolating at least some digital signals at said power island boundaries;
    wherein said actions (a) and (b) are jointly performed, for a respective line at a respective boundary, by a respective protected-isolation cell.

2. The method of claim 1, wherein said clamping action is performed differently, at different locations, to provide desired drive conductances on various lines.

3. The method of claim 1, wherein said isolating action is performed differently, at different locations, to provide a desired signal state at entry to an unpowered island.

4. The method of claim 1, wherein said isolating action is performed differently, at different locations, to provide a signal state, at entry to an unpowered island, which can optionally be latched to its previous value.

5. The method of claim 1, wherein said clamping action is performed by at least one depletion diode.

6. The method of claim 1, wherein said clamping action is performed only by N-channel transistors.

7. The method of claim 1, wherein said clamping action is performed by only two transistors per line.

8. The method of claim 1, wherein said clamping action constrains both overvoltages and undervoltages.

9. A method for operating an integrated circuit which contains multiple power islands, comprising the actions of:
    a) clamping at least some digital signals at power island boundaries, to thereby suppress both overvoltages and undervoltages; and
    b) isolating at least some digital signals at said power island boundaries;
    wherein said actions (a) and (b) are jointly performed, for a respective line at a respective boundary, by a respective protected-isolation cell.

10. The method of claim 9, wherein said clamping action is performed differently, at different locations, to provide desired drive conductances on various lines.

11. The method of claim 9, wherein said isolating action is performed differently, at different locations, to provide a desired signal state at entry to an unpowered island.

12. The method of claim 9, wherein said isolating action is performed differently, at different locations, to provide a signal state, at entry to an unpowered island, which can optionally be latched to its previous value.

13. The method of claim 9, wherein said clamping action is performed by at least one depletion diode.

14. The method of claim 9, wherein said clamping action is performed only by N-channel transistors.

15. The method of claim 9, wherein said clamping action is performed only by only two transistors.

16. A method for operating an integrated circuit which contains multiple power islands, comprising the actions of:
    a) clamping substantially all digital signals which cross any power island's boundary, to thereby suppress overvoltages and undervoltages; and
    b) isolating substantially all non-clock digital signals at said power island boundaries, to thereby suppress propagation of signals across a powered-down island's boundary;
    wherein said actions a and b are jointly performed, for a respective line at a respective boundary, by a respective protected-isolation cell.

17. The method of claim 16, wherein said clamping action is performed differently, at different locations, to provide desired drive conductances on various lines.

18. The method of claim 16, wherein said isolating action is performed differently, at different locations, to provide a desired signal state at entry to an unpowered island.

19. The method of claim 16, wherein said isolating action is performed differently, at different locations, to provide a signal state, at entry to an unpowered island, which can optionally be latched to its previous value.

20. The method of claim 16, wherein said clamping action is performed by at least one depletion diode.

21. The method of claim 16, wherein said clamping action is performed only by N-channel transistors.

22. The method of claim 16, wherein said clamping action is performed by only two transistors per line.

23. An integrated circuit comprising;
    a power island connected to digital signals; and
    a protected-isolation cell associated with the power island, the protected-isolation cell configured to both clamp voltage excursions of the digital signals when the power island is ON, and isolate the digital signals connected to the power island when the power island is OFF.

24. The integrated circuit of claim 23, further comprising a second power island and a second protected-isolation cell associated with the second power island, wherein the protected-isolation cells use different device widths, at different locations on the same chip, to provide desired drive conductances on various lines.

25. The integrated circuit of claim 23, further comprising a second power island and a second protected-isolation cell associated with the second power island, wherein the protected-isolation cells use different isolation logic, at different locations on the same chip, to provide a desired signal state at entry to an unpowered power island.

26. The integrated circuit of claim 23, wherein the protected-isolation cell uses isolation logic to retain a previous signal state at entry to the power island.

27. The integrated circuit of claim 23, wherein the protected-isolation cell comprises depletion diodes for clamping.

28. The integrated circuit of claim 23, wherein the protected-isolation cell comprises N-channel transistors for clamping.

29. The integrated circuit of claim 23, wherein the protected-isolation cell comprises two transistors per line for clamping.

30. The integrated circuit of claim 23, wherein the protected-isolation cell clamps both overvoltages and undervoltages.

31. The integrated circuit of claim 23, further comprising at least one always-on section, which is powered up whenever the integrated circuit is initially powered up.

32. The integrated circuit of claim 23, further comprising at least one always-on section, which is powered up whenever the integrated circuit is initially powered up, and which can initiate power-up of the power island.

33. The integrated circuit of claim 23, further comprising at least one always-on section, which is powered up whenever the integrated circuit is initially powered up, and which also controls a switching circuit which supplies power to the power island.

34. An integrated circuit comprising;
multiple power islands; and
protected-isolation cells, at substantially all locations where non-clock digital signals connect to one of the power islands, the protected-isolation cells configured to both clamp voltage excursions of the non-clock digital signals when the one of the power islands is powered on, and isolate the non-clock digital signals connected to the one of the power islands when the one of the power islands is powered off.

35. The integrated circuit of claim 34, wherein the protected-isolation cells use different device widths, at different locations on the same chip, to provide desired drive conductances on various lines.

36. The integrated circuit of claim 34, wherein the protected-isolation cells use different isolation logic, at different locations on the same chip, to provide a desired signal state at entry to the one of the power islands when the one of the power islands is unpowered.

37. The integrated circuit of claim 34, wherein some ones of the protected-isolation cells use isolation logic to retain a previous signal state at entry to the one of the power islands when the one of the power islands is unpowered.

38. The integrated circuit of claim 34, wherein the protected-isolation cells comprise depletion diodes for clamping.

39. The integrated circuit of claim 34, wherein the protected-isolation cells comprise N channel transistors for clamping.

40. The integrated circuit of claim 34, wherein the protected-isolation cells comprise two transistors per line for clamping.

41. The integrated circuit of claim 34, wherein the protected-isolation cells clamp both overvoltages and undervoltages.

42. An integrated circuit comprising;
a power island connected to digital signal lines, the power island comprising electrical circuits which are not always powered up; and
a protected-isolation cell electrically interposed between the electrical circuits of the power island and the digital signal lines;
wherein the protected-isolation cell comprises voltage clamps;
wherein, when the power island is powered up, the protected-isolation cell connects digital signals between the electrical circuits of the power island and the digital signal lines, while limiting voltage excursions on the digital signal lines; and
wherein, when the power island is not powered up, the protected-isolation cell prevents propagation of digital signals from the circuits of the power island onto the digital signal lines.

43. The integrated circuit of claim 42, wherein the protected-isolation cell uses different isolation logic to provide a desired signal state at a boundary of the power island when unpowered.

44. The integrated circuit of claim 42, wherein the protected-isolation cell comprises depletion diodes for limiting voltage excursions.

45. The integrated circuit of claim 42, wherein the protected-isolation cell comprises N-channel transistors for limiting voltage excursions.

46. The integrated circuit of claim 42, wherein the protected-isolation cell comprises two transistors per line for limiting voltage excursions.

47. The integrated circuit of claim 42, wherein the protected-isolation cell clamps both overvoltages and undervoltages.

48. The integrated circuit of claim 42, further comprising at least one always-on section, which is powered up whenever the integrated circuit is initially powered up.

49. The integrated circuit of claim 42, further comprising at least one always-on section, which is powered up whenever the integrated circuit is initially powered up, and which can initiate power-up of the power island.

50. The integrated circuit of claim 42, further comprising at least one always-on section, which is powered up whenever the integrated circuit is initially powered up, and which also controls a switching circuit which supplies power to the power island.

* * * * *